(12) United States Patent
Peng et al.

(10) Patent No.: US 9,398,729 B2
(45) Date of Patent: Jul. 19, 2016

(54) SERVER CABINET

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Wen-Tang Peng, New Taipei (TW); Xiao-Zheng Li, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 62 days.

(21) Appl. No.: 14/542,133

(22) Filed: Nov. 14, 2014

(65) Prior Publication Data
US 2015/0289417 A1    Oct. 8, 2015

(30) Foreign Application Priority Data

Apr. 3, 2014 (CN) .......................... 2014 1 0132776

(51) Int. Cl.
*H05K 7/20* (2006.01)
(52) U.S. Cl.
CPC .............. *H05K 7/20736* (2013.01); *H05K 7/20* (2013.01); *H05K 7/20145* (2013.01)
(58) Field of Classification Search
CPC .. H05K 7/20; H05K 7/20736; H05K 7/20145
USPC ............ 361/679.5, 687, 692, 695; 174/35 R; 454/184; 312/223.1
See application file for complete search history.

(56) References Cited

U.S. PATENT DOCUMENTS

| 8,257,155 | B2* | 9/2012 | Lewis, II | ............ | H05K 7/20009 |
| | | | | | 361/690 |
| 2005/0153649 | A1* | 7/2005 | Bettridge | ............ | H05K 7/20736 |
| | | | | | 454/188 |
| 2005/0168945 | A1* | 8/2005 | Coglitore | ............ | H05K 7/20736 |
| | | | | | 361/695 |

* cited by examiner

*Primary Examiner* — Dion R Ferguson
*Assistant Examiner* — Mandeep S Buttar
(74) *Attorney, Agent, or Firm* — ScienBiziP, P.C.

(57) ABSTRACT

A server cabinet includes a bottom wall, a top wall, two opposite side walls, two air inlet tubes each with a number of openings, a number of servers, a number of air distributing tubes received in the servers, a number of rotating members rotatably installed to the air inlet tubes, and a number of resilient members installed to the air inlet tubes. Each server defines a number of vents aligning with the corresponding openings of the air inlet tubes. Each air distributing tube communicates with the vents of the corresponding server. The air inlet tubes are attached to the side walls. Each air distributing tube defines a number of air outlets communicating with the corresponding server. Each rotating member includes a shielding plate. Each resilient member abuts against the corresponding shielding plate to cover the corresponding opening of the air inlet tubes.

20 Claims, 10 Drawing Sheets

SERVER CABINET

FIELD

The subject matter herein generally relates to a server cabinet.

BACKGROUND

A server cabinet includes a cabinet and many servers can be arranged in the cabinet. It is well known that the servers in such an arrangement may generate a considerable amount of heat during operation, particularly when they densely occupy the cabinet space. If the heat is not efficiently removed, the servers may suffer damage. Thus, heat dissipation for the cabinet is very important.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The present disclosure is described in relation to a server cabinet.

Figure 1:
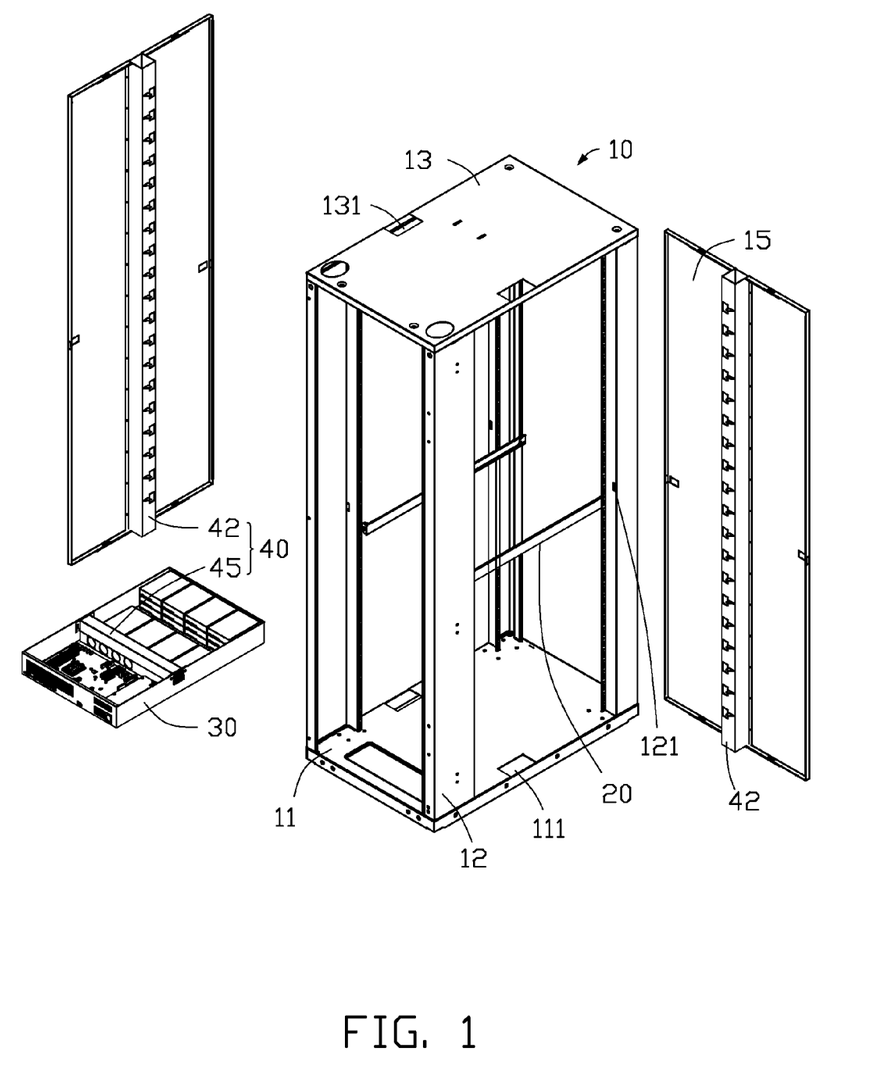
FIG. 1 is an exploded, isometric view of an embodiment of a server cabinet, wherein the server cabinet includes a cabinet, a plurality of servers and two ventilation apparatuses.

FIG. 1 illustrates an embodiment of a server cabinet comprising a cabinet 10, a plurality of pairs of rails 20 mounted in the cabinet 10, a plurality of servers 30 configured to be received in the cabinet 10 through the pairs of rails 20, and a ventilation system 40. The ventilation system 40 comprises two ventilation apparatus 42 and a plurality of air absorbing apparatuses 45.

The cabinet 10 comprises a substantially rectangular bottom wall 11, four supporting poles 12 substantially perpendicularly extending up from four corners of the bottom wall 11, a top wall 13 mounted on top ends of the supporting poles 12, and two opposite side walls 15 mounted beside two sides of the supporting poles 12. The ventilation apparatus 42 are mounted to inner surfaces of the side walls 15. The rails 20 are mounted to inner sides of the supporting poles 12. A middle of each supporting pole 12 defines an installing hole 121. The top wall 13 defines two opposite first through holes 131 in middles of opposite sides of the top wall 13. The bottom wall 11 defines two opposite second through holes 111 in middles of opposite sides of the bottom wall 11. The first through holes 131 are aligned with the second through holes 111.

Figure 2:
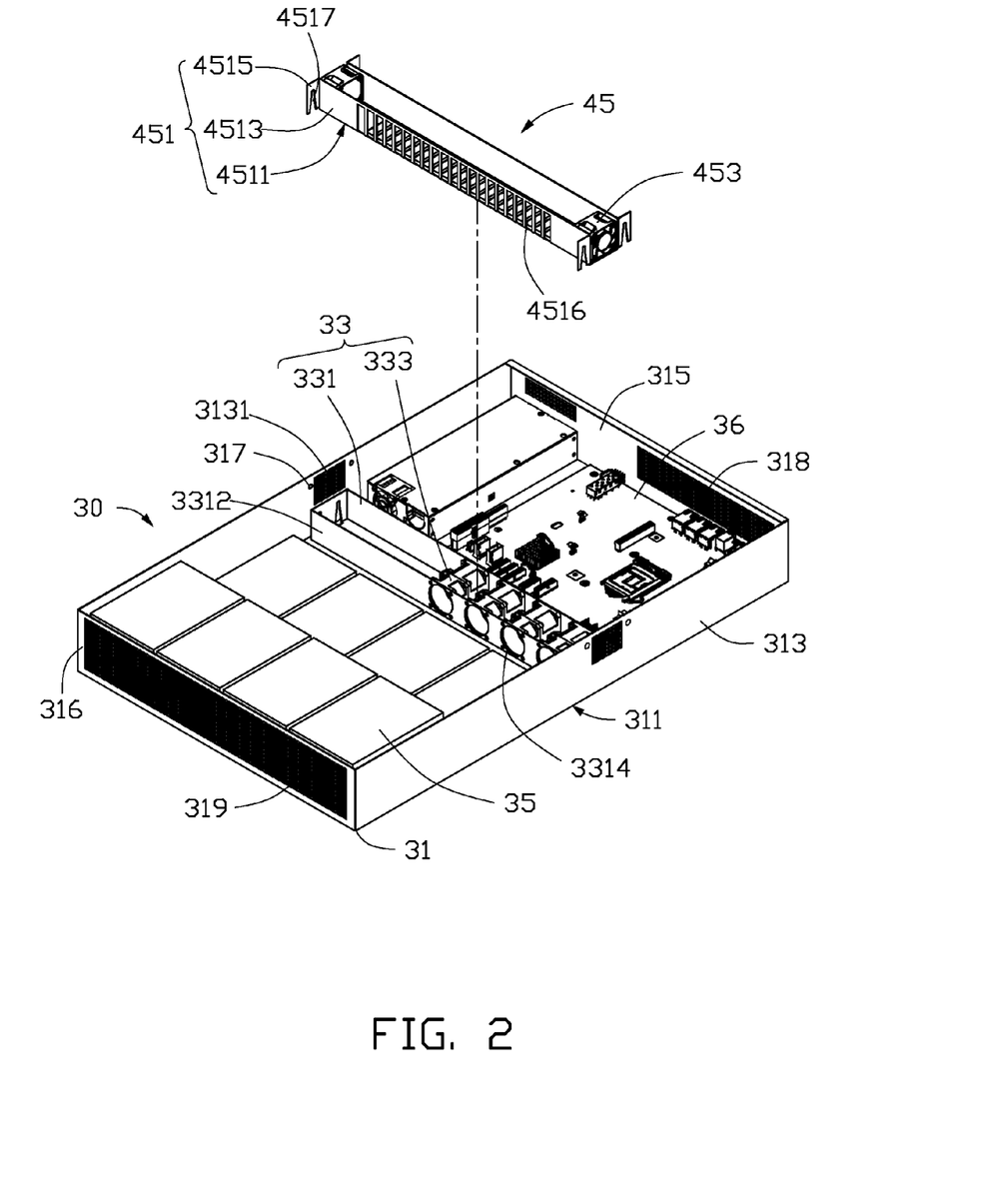
FIG. 2 is an exploded, isometric view of one of the servers of FIG. 1.

FIG. 2 illustrates that one of the servers 30, the server 30 comprises a chassis 31, a dissipating assembly 33 received in a middle of the chassis 31, a plurality of hard disk drives 35 received in a rear of the chassis 31, a motherboard 36 received in a front of the chassis 31. The dissipating assembly 33 is located between the hard disk drives 35 and the motherboard 36. The chassis 31 comprises a substantially rectangular bottom plate 311, two opposite side plates 313 substantially perpendicularly extending up from two opposite sides of the bottom plate 311, a front plate 315 substantially perpendicularly extending up from a front side of the bottom plate 311 and coupled to the side plates 313, and a rear plate 316 substantially perpendicularly extending up from a rear side of the bottom plate 311 and coupled to the side plates 313.

The dissipating assembly 33 comprises a substantially rectangular receiving shell 331 supported on a middle of the bottom plate 311 and a plurality of fans 333 installed to the receiving shell 331. Two opposite ends of the receiving shell 331 are substantially perpendicularly mounted to lower portions of the side plates 313. The receiving shell 331 comprises two opposite position plates 3312 substantially perpendicular to the side plates 313. The position plates 3312 define a plurality of ventilation holes 3314. The fans 333 are sandwiched between the position plates 3312 and aligned with the corresponding ventilation holes 3314. Each side plate 313 defines a plurality of vents 3131 above the receiving shell 331. Two tabs 317 protrude from two opposite ends of the vents 3131 of an inner surface of each side plate 313. The front plate 315 defines a plurality of vents 318. The rear plate 316 defines a plurality of vents 319. The hard disk drives 35 are located between the rear plate 316 and the receiving shell 331, and the motherboard 36 is located between the front plate 318 and the receiving shell 331.

The air absorbing apparatus 45 comprises an air distributing tube 451 and two fans 453 mounted to two opposite ends of the air distributing tube 451. The air distributing tube 451 comprises a substantially rectangular bottom plate 4511, two opposite side plates 4513 substantially perpendicularly extending up from two opposite sides of the bottom plate 4511, two pieces 4515 substantially perpendicularly extending out from two opposite ends of each side plate 4513. One of the side plates 4513 defines a plurality of air outlets 4516 arranged along a lengthwise direction of the side plate 4513. A bottom end of each piece 4515 defines a substantially V-shaped cutout 4517.

In assembly of each absorbing apparatus 45 to the corresponding server 30, the air absorbing apparatus 45 is received in the server 30, two ends of the air distributing tube 451 are aligned with the vents 3131 of the side plates 313, and the air outlets 4516 of the air distributing tube 451 face the hard disk drives 35. The tabs 317 of each side plate 313 are latched in the corresponding cutouts 4517, and the bottom plate 4511 is supported on the receiving shell 331. Thus, the air absorbing apparatus 45 is mounted in the server 30, and the fans 453 of the air absorbing apparatus 45 are aligned with the corresponding vents 3131.

Figure 3:
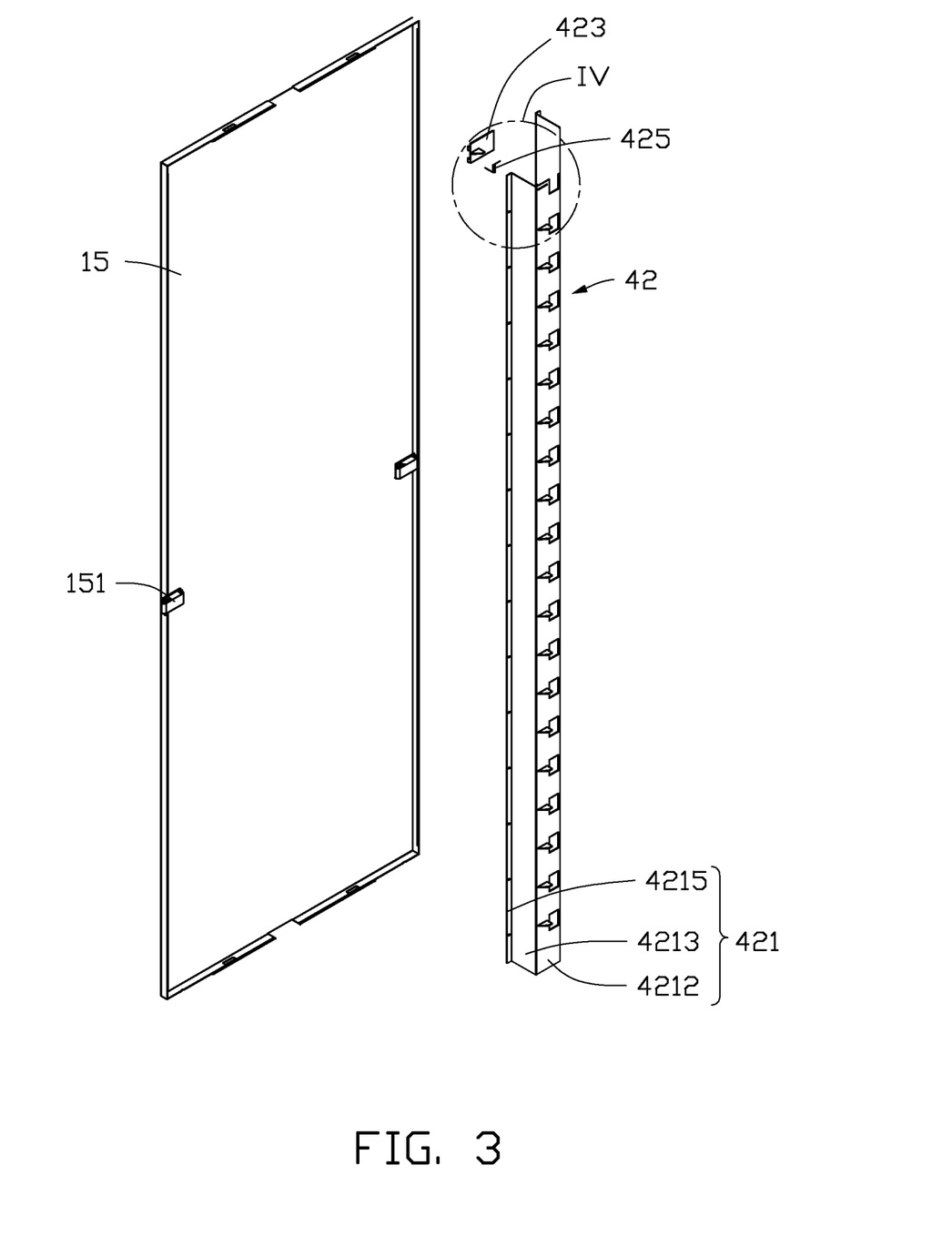
FIG. 3 is an exploded, isometric view of one of the ventilation apparatuses of FIG. 1, wherein each ventilation apparatus includes a plurality of adjusting apparatuses.
Figure 4:
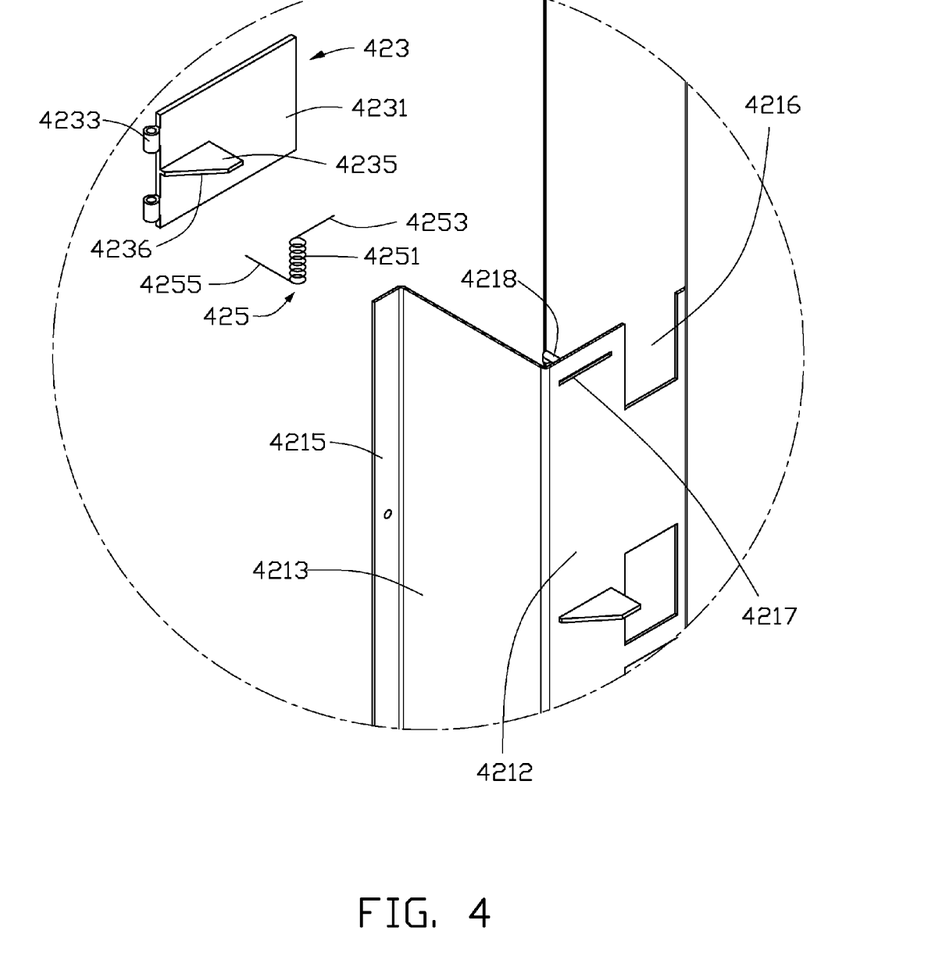
FIG. 4 is an enlarged, isometric view of a circled portion IV of FIG. 3.

FIG. 3 and FIG. 4 illustrate that one of the ventilation apparatuses 42, the ventilation apparatus 42 comprises an air inlet tube 421 vertically mounted on an inner surface of the corresponding side wall 15, a plurality of rotating members 423, and a plurality of resilient members 425. The air inlet tube 421 comprises a substantially rectangular connecting plate 4212 parallel to and spaced from the corresponding side wall 15, two side plates 4213 substantially perpendicularly extending from two opposite sides of the connecting plate 4212, and two flanges 4215 substantially perpendicularly extending from distal sides of the side plates 4213 mounted to the sidewall 15. One side of the connecting plate 4212 defines a plurality of openings 4216 arrayed along a lengthwise direction of the connecting plate 4212, and the other side of the connecting plate 4212 defines a plurality of adjusting slots 4217 arrayed along the lengthwise direction of the connecting plate 4212. Each adjusting slot 4217 aligns with the corresponding opening 4216. A pair of substantially L-shaped and resilient connecting poles 4218 perpendicularly extend from the connecting plate 4212, respectively located near two opposite sides of each adjusting slots 4217 and away from the corresponding adjusting slot 4217, and extending in a direction same as the side plates 4213. Each connecting pole 4218 includes a first portion perpendicular to the connecting plate 4212 and a second portion perpendicularly extending from the first portion. The second portions of each pair of connecting pole 4218 extend toward each other. Two latching members 151 are formed at middles of opposite sides of the side wall 15.

Each rotating member 423 comprises a substantially rectangular shielding plate 4231, two sleeves 4233 formed at one end of the shielding plate 4231, and an abutting plate 4235 substantially perpendicularly extending out from the shielding plate 4231. The abutting plate 4235 is located adjacent to the sleeves 4233. A slanted abutting surface 4236 is formed on an end of the abutting plate 4235 facing the sleeves 4233.

In the embodiment, each resilient member 425 is a spring. The resilient member 425 comprises a main body 4251. A first connecting portion 4253 and a second connecting portion 4255 extend out from two opposite ends of the main body 4251.

Figure 5:
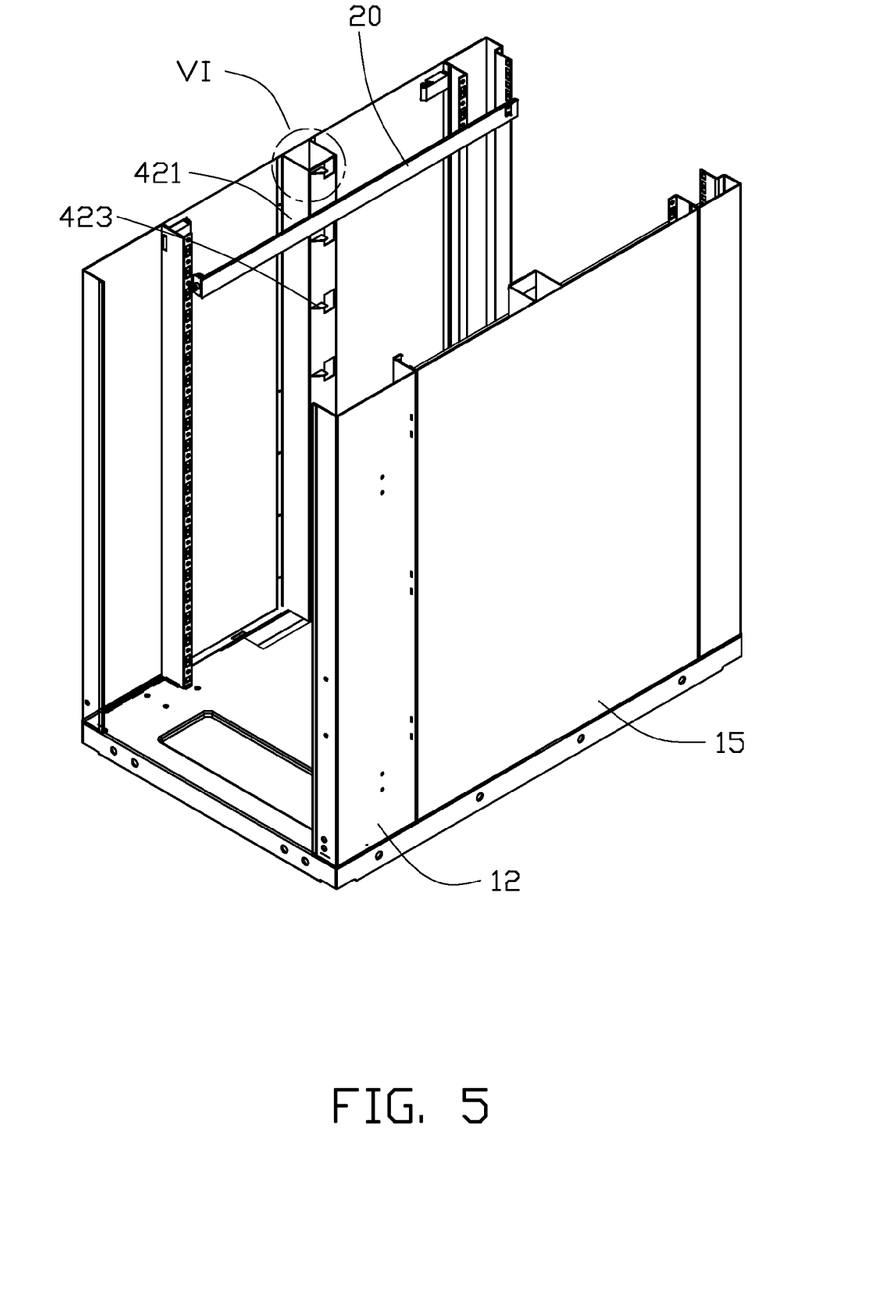
FIG. 5 is a partial assembled, cutaway, isometric view of FIG. 1.
Figure 6:
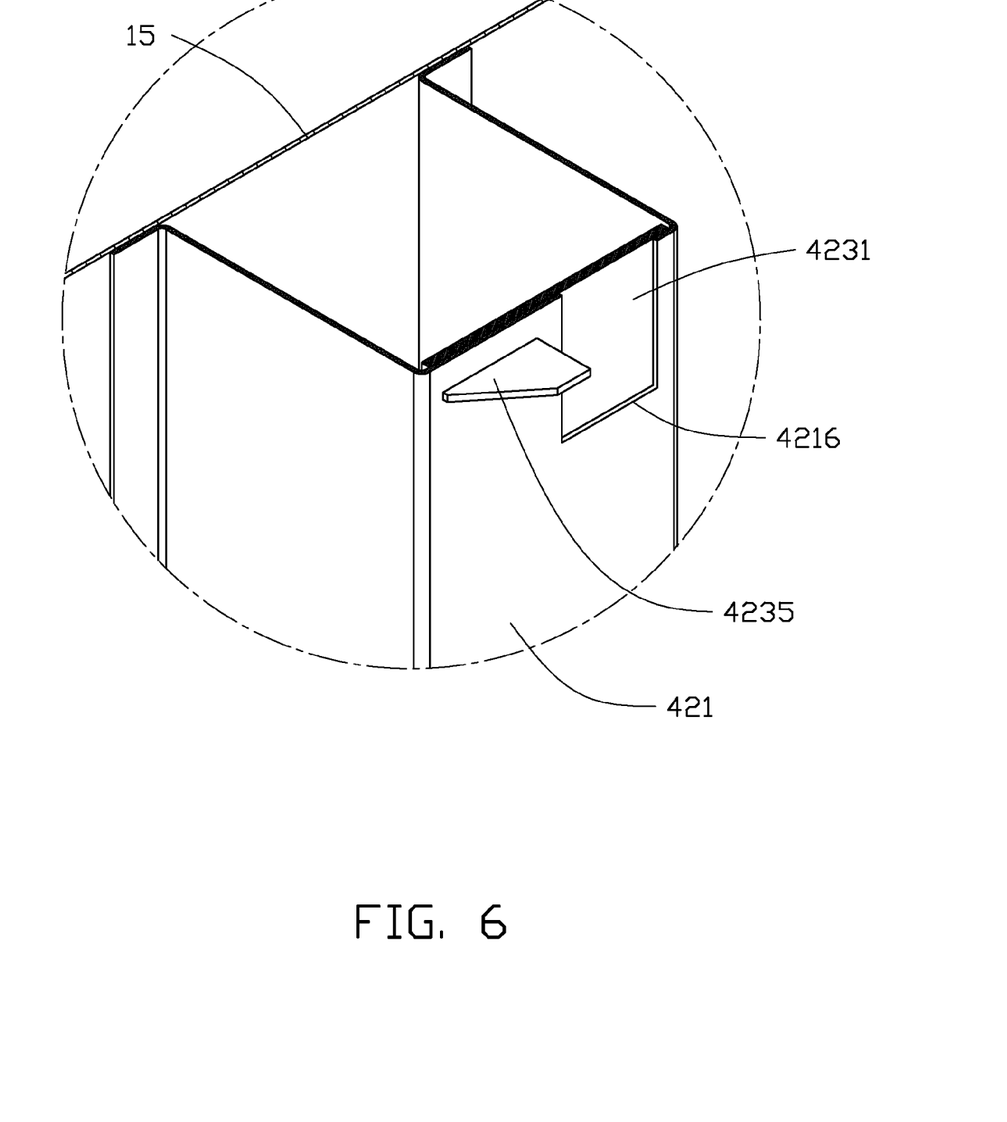
FIG. 6 is an enlarged, isometric view of a circled portion VI of FIG. 5.

FIGS. 5-6 illustrate that the ventilation apparatus 42 and the cabinet 10. In assembly of each ventilation apparatus 42, the main body 4251 of each resilient member 425 is latched between the sleeves 4233 of the corresponding rotating member 423. Each rotating member 423 and the corresponding resilient member 425 are received in the air inlet tube 421, and the abutting plate 4235 of the rotating member 423 aligns with the corresponding adjusting slot 4217. The connecting poles 4218 are squeezed and deformed away from each other, until the second portions of the connecting poles 4218 align with the sleeves 4233. The connecting poles 4218 restore to insert the second portions into the corresponding sleeves 4233. The sleeves 4233 of each rotating member 423 abut against the first portions of the corresponding connecting poles 4218. Each rotating member 423 is rotatably connected to the air inlet tube 421. The second connecting portion 4255 of each resilient member 425 abuts against an inner surface of one side plate 4213, and the first connecting portion 4253 of the resilient member 425 abuts against the shielding plate 4231 of the corresponding rotating member 423, to rotate the rotating member 423 toward the connecting plate 4212 of the air inlet tube 421, until the shielding plate 4231 is engaged against an inner surface of the connecting plate 4212. The abutting plate 4235 of each rotating member 423 extends through the corresponding adjusting slot 4217, the abutting surface 4236 is exposed out of the connecting plate 4212, and the shielding plate 4231 of the rotating member 423 covers the corresponding opening 4216. A combination of each air inlet tube 421 and the corresponding rotating members 423 is mounted to a middle of the inner surface of the corresponding side wall 15. Each air inlet tube 421 extends along a lengthwise direction of the corresponding side wall 15.

The side walls 15 are installed to two opposite sides of the cabinet 10, and the latching members 151 are latched into the corresponding installing holes 121. A top end of each air inlet tube 421 is aligned with the corresponding first through hole 131 of the cabinet 10, and a bottom end of the air inlet tube 421 is aligned with the corresponding second through hole 111. The abutting surface 4236 of each rotating member 423 faces a front end of the cabinet 10.

Figure 7:
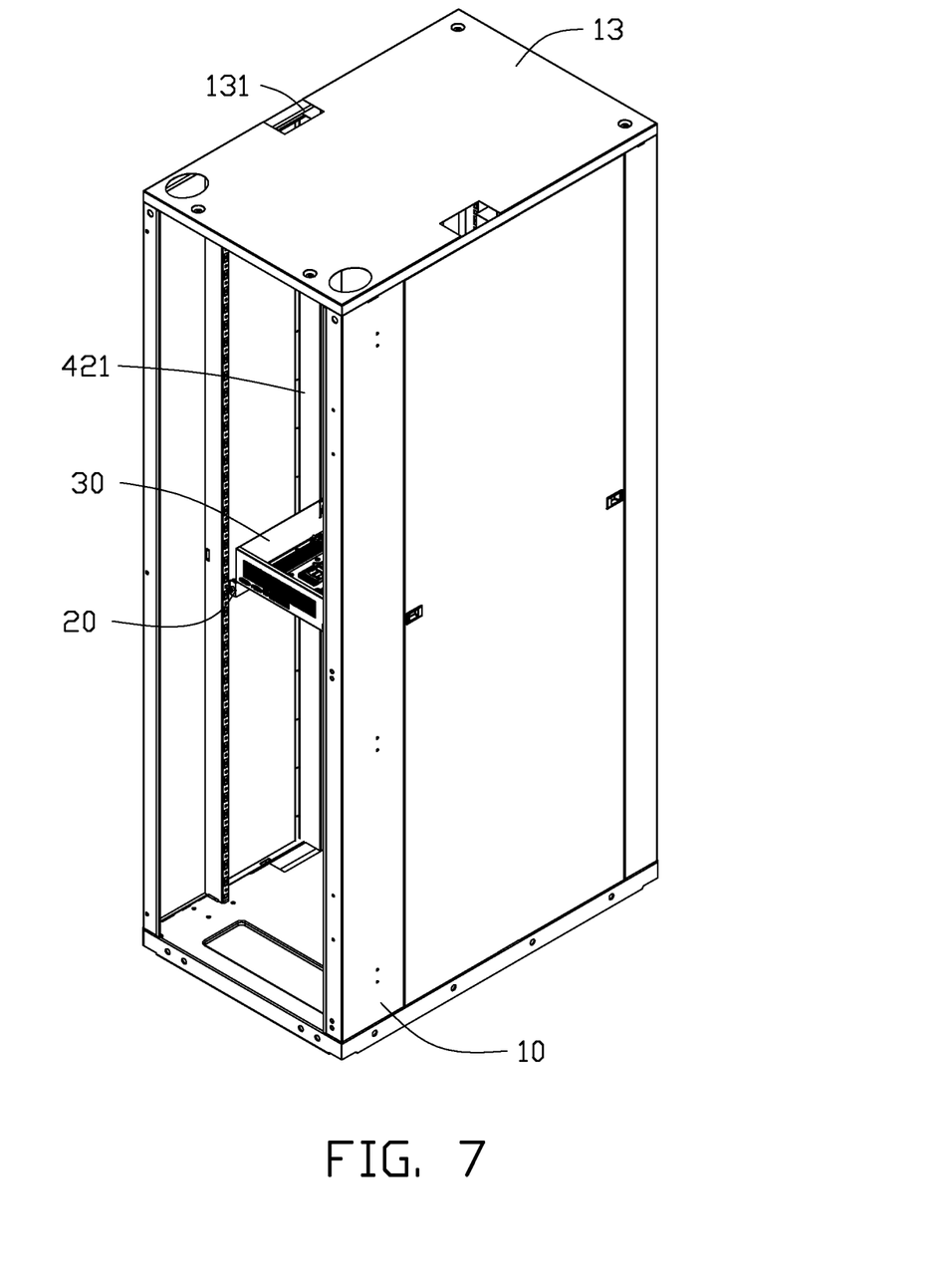
FIG. 7 is an assembled, isometric view of FIG. 1.
Figure 8:
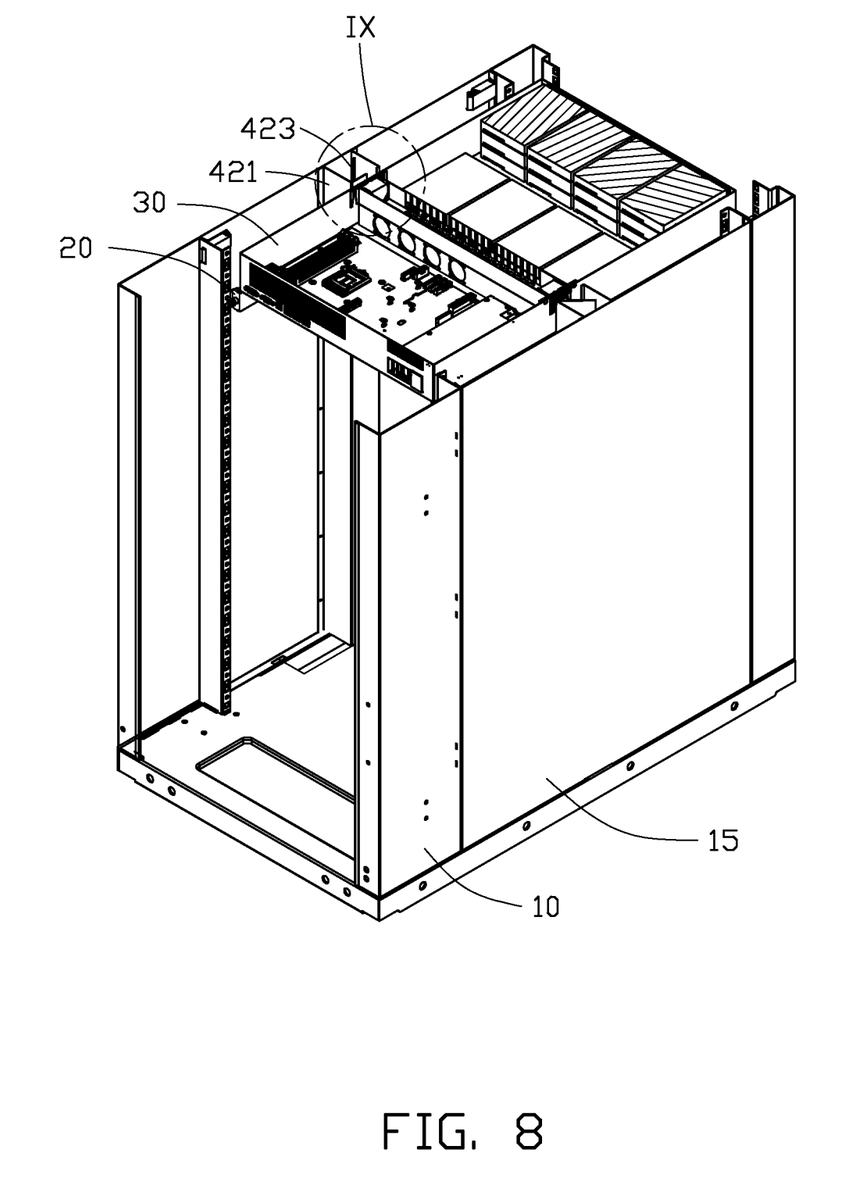
FIG. 8 is a partial, cutaway, isometric view of FIG. 7.
Figure 9:
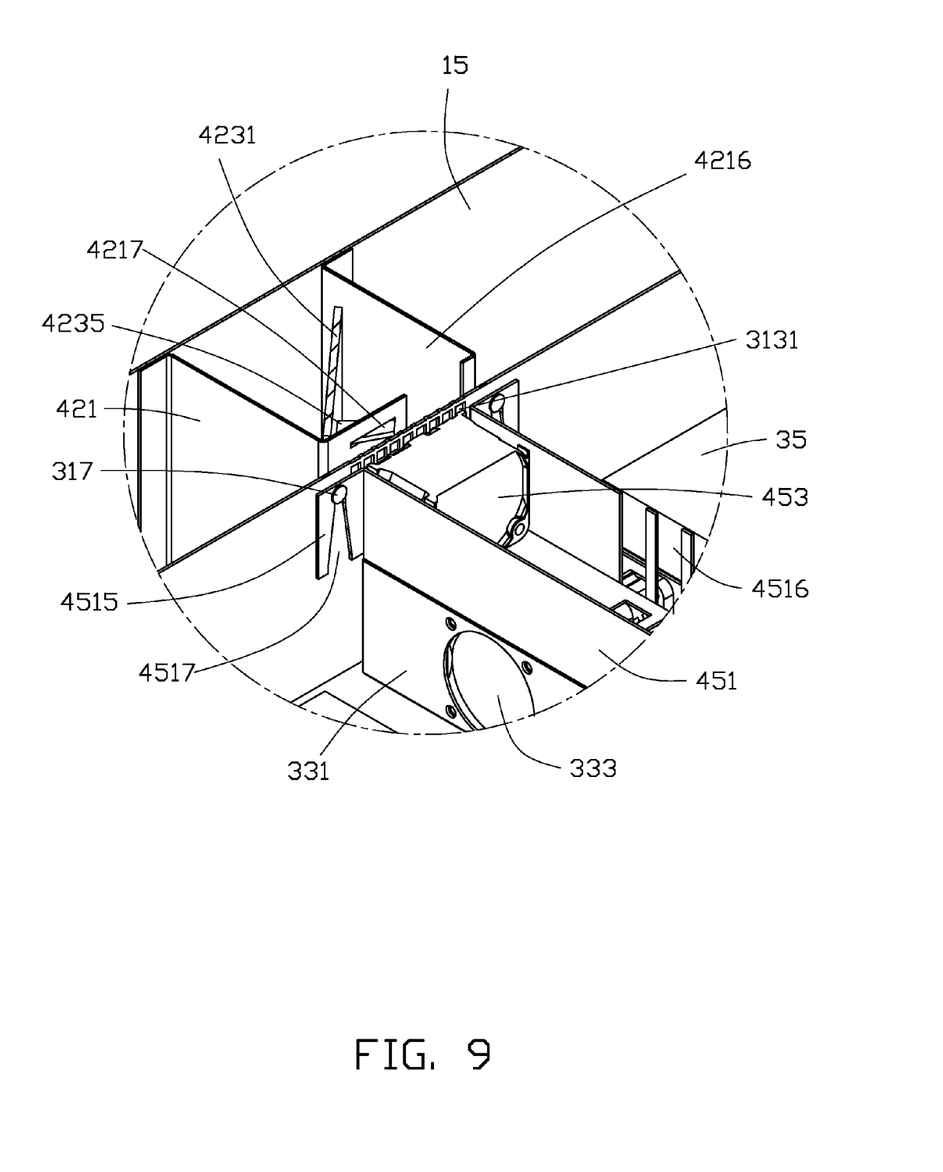
FIG. 9 is an enlarged, isometric view of a circled portion IX of FIG. 8.

FIGS. 7-9 illustrate the server cabinet in use, a rear end of each server 30 is inserted into the cabinet 10 from the front end of the cabinet 10 through the corresponding pair of rails 20. Two opposite ends of the rear plate 316 of each server 30 slidably abut against the abutting surfaces 4236 of the corresponding rotating members 423, to rotate the shielding plates 4231 of the rotating members 423 away from the corresponding connecting plates 4212 to deform the resilient members 425. The server 30 further slides toward the rear end of the cabinet 10, and the side plates 313 slidably abut against the abutting surfaces 4236 of the corresponding rotating members 423, until the server 30 is entirely installed in the cabinet 10. The vents 3131 of each server 30 are aligned with the openings 4216 of the corresponding air inlet tube 421. Thereby, the air distributing tube 451 of each server 30 is communicated with the air inlet tubes 421.

Figure 10:
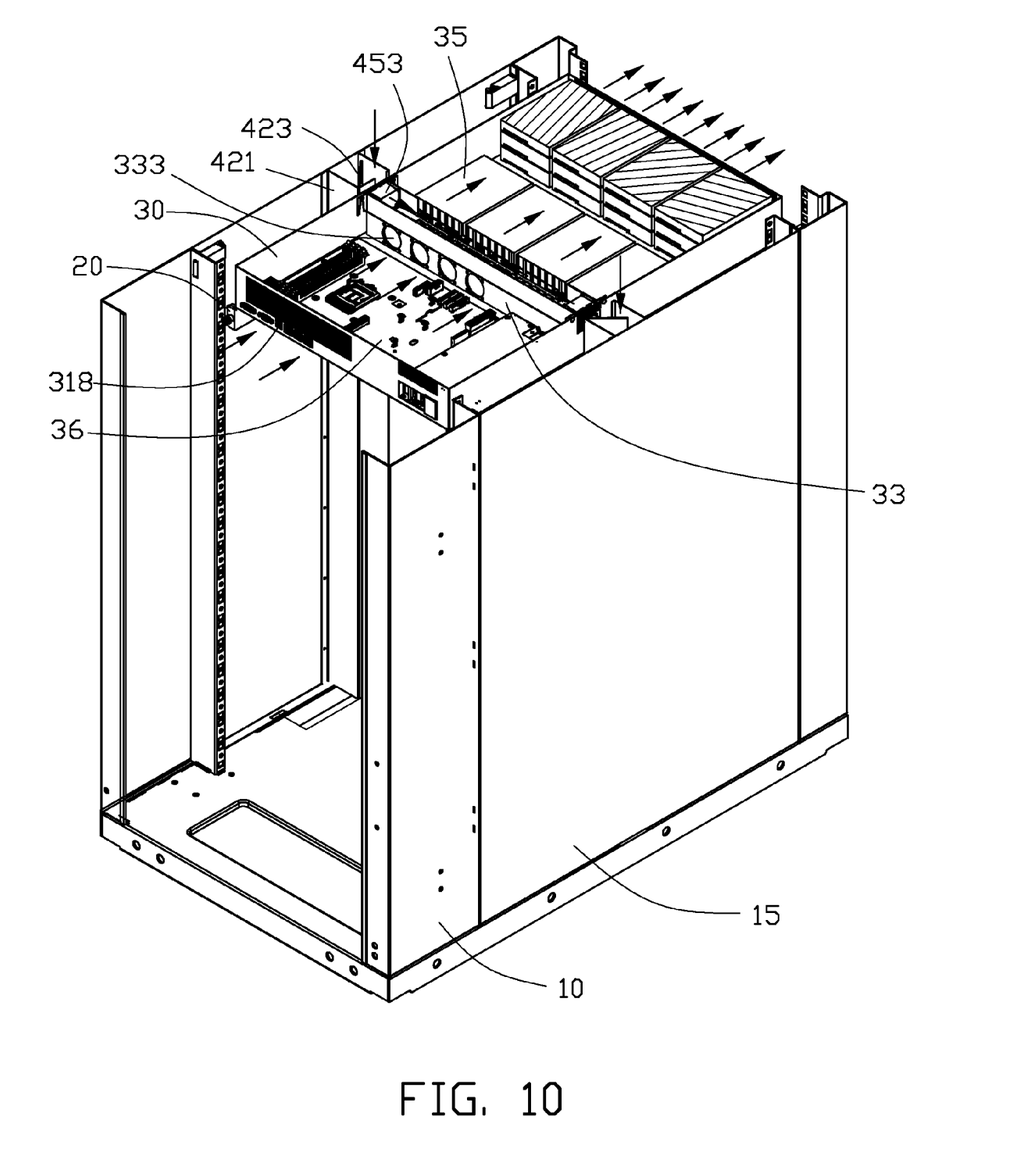
FIG. 10 is similar to FIG. 8, but showing the server cabinet in a state of use.

FIG. 10 illustrates the server cabinet in use, the servers 30 are used in the cabinet 10, the fans 333 of each server 30 drive cool air to flow into the server 30 through the vents 318 of the front plate 315. The cool air passes through the mother board 36, the dissipating assembly 33, and the hard disk drivers 35 and becomes heated air by heat exchanging with the mother board 36 and the hard disk drivers 35. The heated air can flow out of the server 30 through the vents 319 of the rear plate 316. The fans 453 of each air absorbing apparatus 45 drive cool air out of the cabinet 10 to flow into the air inlet tube 421 through the first though holes 131 and the second though holes 111, and the cool air flows into the air distributing tube 451 through the openings 4216 of the air inlet tubes 421, the vents 3131 of the side plates 313, and the fans 453. The cool air flows into the server 30 through the air outlets 4516 of the air absorbing apparatus 45, and passes through the hard disk drivers 35 and becomes heated air by heat exchanging with the hard disk drives 35. The heated air can flow out of the server 30 through the vents 319 of the rear plate 316.

Even though numerous characteristics and advantages of the embodiments have been set forth in the foregoing description, together with details of the structure and function of the embodiments, the present disclosure is illustrative only, and changes may be made in detail, including in the matters of shape, size, and arrangement of parts within the principles of the embodiments to the full extent indicated by the broad general meaning of the terms in which the appended claims are expressed.

What is claimed is:

1. A server cabinet comprising:
   a cabinet;
   a plurality of servers configured to be received in the cabinet; and
   a ventilation system comprising an air inlet tube mounted to a side wall of the cabinet, a plurality of air distributing tubes respectively received in the servers, a plurality of rotating members rotatably installed to the air inlet tube, and a plurality of resilient members sandwiched between the rotating members and the air inlet tube;
   wherein the air inlet tube defines a plurality of openings aligning with the servers, each server defines a plurality of vent communicating with the corresponding openings of the air inlet tube, an end of each air distributing tubes is communicated with the vent of the corresponding server;
   wherein, each air distributing tube defines a plurality of air outlets communicating with the corresponding server;
   wherein each rotating member comprises a shielding plate, each resilient member abuts against the corresponding shielding plate and the air inlet tube to shield the corresponding opening; and
   wherein, when one of the servers is inserted into the cabinet, the server abuts against the corresponding rotating member to rotate the shielding plate away from the corresponding opening of the air inlet tube, until the corresponding opening of the air inlet tube aligns with the vent of the corresponding server, the resilient member is deformed, cool air out of the cabinet flows into the corresponding air distributing tube though the corresponding opening of the air inlet tube and the vent of the server and flows into the server through the air outlets of the corresponding air distributing tube.

2. The server cabinet of claim 1, wherein the air inlet tube comprises a connecting plate spaced from the side wall of the cabinet and two side plates extending from two opposite sides of the connecting plate, the side plates are mounted to the side wall of the cabinet, and the openings are defined in the connecting plate.

3. The server cabinet of claim 2, wherein the connecting plate defines a plurality of adjusting slots opposite to the openings, each rotating member further comprises an abutting plate extending out from the corresponding shielding plate to extend through the corresponding adjusting slot, one of the servers abuts against the corresponding abutting plate to rotate the shielding plate away from the corresponding opening, until the corresponding opening of the air inlet tube communicating with the vent of the corresponding server and the air distributing tube.

4. The server cabinet of claim 3, wherein the air inlet tube further comprises a plurality pairs of connecting poles, each pairs of connecting poles extend from the connecting plate, respectively located near two opposite sides of each adjusting slots, each rotating member further two sleeves formed at an end of the shielding plate adjacent to the corresponding abutting plate, the sleeves of each rotating member are rotatably connected to the corresponding connecting pole.

5. The server cabinet of claim 4, wherein an end of each abutting plate forms a slanted abutting surface facing the corresponding sleeve.

6. The server cabinet of claim 1, wherein the ventilation system further comprises a fan mounted to each air distributing tube, each fan drives cool air out of the cabinet to flow into the air inlet tube, and the cool air flows into the corresponding air distributing tube through the corresponding opening, vent of the corresponding server and the fan.

7. The server cabinet of claim 1, wherein each server comprises a dissipating assembly received in the server below the corresponding air distributing tube, the dissipating assembly comprises a receiving shell and a plurality of fans installed to the receiving shell, the fans of each server drive cool air to flow into the server from a first end of the server, flow out of the server through a second end of the server.

8. The server cabinet of claim 1, wherein each resilient member comprises a first connecting portion abutting against the corresponding rotating member and a second connecting portion abutting against the corresponding air inlet tube.

9. A server cabinet comprising:
   a bottom wall;
   a top wall opposite to and substantially parallel to the bottom wall;
   two opposite side walls perpendicularly positioned between the top wall and the bottom wall;
   two air inlet tubes respectively attached to the two side walls and each with a plurality of openings;
   a plurality of servers configured to be received in the cabinet, wherein two side plate of each server defines a plurality of vents aligning with the corresponding openings of the air inlet tubes;
   a plurality of air distributing tubes received in the servers, wherein each air distributing tube communicates with the vents of the corresponding server;
   a plurality of rotating members rotatably installed to the air inlet tubes; and
   a plurality of resilient members installed between the air inlet tubes and the corresponding rotating member;
   wherein, the air inlet tubes are respectively attached to the side walls and the two wall and the bottom wall each configured with an through hole to receive the air inlet tubes;
   wherein, each air distributing tube defines a plurality of air outlets communicating with the corresponding server;
   wherein, each rotating member comprises a shielding plate, each resilient member urges the corresponding shielding plate to cover the corresponding opening of the air inlet tubes; and
   wherein, when servers are received in the cabinet between the side walls, each server engages with the air inlet tubes, each rotating member is abutted against through the corresponding server to rotate the corresponding shielding plate to uncover the corresponding opening, deforming the corresponding resilient member, and each air distributing tube communicates with the air inlet tubes.

10. The server cabinet of claim 9, wherein each air inlet tube comprises a connecting plate spaced from the corresponding side wall of the cabinet and two side plates extending from two opposite sides of the connecting plate, the side plates are mounted to the side wall of the cabinet, and the openings are defined in the connecting plate.

11. The server cabinet of claim 10, wherein each connecting plate defines a plurality of adjusting slots opposite to the openings, each rotating member further comprises an abutting plate extending out from the corresponding shielding plate to extend through the corresponding adjusting slot, the servers abuts against the corresponding abutting plates to rotate the shielding plates away from the corresponding openings, until the openings of the air inlet tubes align with the vent of the servers.

12. The server cabinet of claim 11, wherein each air inlet tube further comprises a plurality pairs of connecting poles, each pairs of connecting poles extend from the connecting plate, respectively located near two opposite sides of each adjusting slots, each rotating member further two sleeves formed at an end of the shielding plate adjacent to the corresponding abutting plate, the sleeves of each rotating member are rotatably connected to the corresponding connecting pole.

13. The server cabinet of claim 12, wherein an end of each abutting plate forms a slanted abutting surface facing the corresponding sleeve, each server abuts against the corresponding abutting surface to rotate the corresponding rotating members.

14. The server cabinet of claim 9, wherein each air distributing tube comprises two fans mounted to two ends of the corresponding air distributing tube, the fans of each air distributing tube drive cool air out of the cabinet to flow into the air inlet tubes through the corresponding through holes of the top side and the bottom side, and the cool air flows into the corresponding air distributing tube through the corresponding openings of the air inlet tubes, the vents of the corresponding server, and the fans.

15. The server cabinet of claim 9, wherein each server comprises a dissipating assembly received in the server below the air distributing tube, the dissipating assembly comprises a receiving shell and a plurality of fans installed to the receiving shell, the fans of each server drive cool air to flow into the server from a first end of the server, flow out of the server through a second end of the server.

16. The server cabinet of claim 9, wherein each resilient member comprises a first connecting portion abutting against the corresponding rotating member and a second connecting portion abutting against the corresponding air inlet tube.

17. A cabinet and server combination with a ventilation system, comprising:
a cabinet with:
a bottom side;
a top side opposite, and substantially parallel, to the bottom side;
a first side substantially perpendicular to the bottom side and the top side; and
a second side substantially perpendicular to the bottom side and the top side, the second side is opposite, and substantially parallel, to the first side, and the first side and the second side extending from the bottom side to the top side and the first side has a first side inner surface facing the second side and the second side has a second side inner surface facing the first side; and
a plurality of servers;
wherein, the cabinet is configured to receive the plurality of servers and the servers are configured to be received by the cabinet;
wherein, the cabinet includes a first portion of the ventilation system, having:
a first air inlet tube mounted on the first side inner surface, the first air inlet tube having an inner surface, facing the inner surface of the second side, and with a plurality of first air inlet tube air openings defined in the first air inlet tube inner surface;
a second air inlet tube mounted on the second side inner surface, the second air inlet tube having an inner surface, facing the inner surface of the first side, and with a plurality of second air inlet tube air openings defined in the second air inlet tube inner surface; and
a plurality of rotating members rotatably connected to the first air inlet tube and the second air inlet tube, each of the plurality of rotating members positionable to substantially cover one of the plurality of first air inlet tube openings or one of the plurality of second air inlet tube openings and comprising a shield plate and a resilient member positionable between the shield plate and the air inlet tube;
wherein, each of the plurality of servers includes a second portion of the ventilation system, having:
an air distributing tube connecting a first server vent to a second server vent, the air distributing tube having a plurality of air outlets communicating with an interior space of the server;
a first fan positioned within the air distributing tube adjacent the first server vent; and
a second fan positioned within the air distributing tube adjacent the second server vent;
wherein, when a server is inserted into the cabinet, the resilient member of the rotating member on the first air inlet tube surface and the resilient member of the rotating member on the second air inlet tube surface are deformed, and the shield of each rotating member is moved away from each air inlet tube exposing an opening in each air inlet tube, and the air distributing tube first vent is aligned with the opening defined in the first air inlet tube and the air distributing tube second vent is aligned with the opening in the second air inlet tube; and
wherein, the first portion of the ventilation system and the second portion of the ventilation system cooperate to allow exterior cabinet air to flow into an air inlet tube and into a server air distributing tube to cool the server.

18. The cabinet and server combination of claim 17, wherein each air inlet tube comprises a connecting plate spaced from corresponding side wall of the cabinet and two side plates extending from two opposite sides of the connecting plate, the side plates are mounted to the side wall of the cabinet.

19. The cabinet and server combination of claim 18, wherein each connecting plate defines a plurality of adjusting slots opposite to the openings, each rotating member further comprises an abutting plate extending out from the corresponding shielding plate to extend through the corresponding adjusting slot, the servers abuts against the corresponding abutting plates to rotate the shielding plates away from the corresponding openings, until the openings of the air inlet tubes align with the vent of the servers.

20. The cabinet and server combination of claim 19, wherein each air inlet tube further comprises a plurality pairs of connecting poles, each pairs of connecting poles extend from the connecting plate, respectively located near two opposite sides of each adjusting slots, each rotating member further two sleeves formed at an end of the shielding plate adjacent to the corresponding abutting plate, the sleeves of each rotating member are rotatably connected to the corresponding connecting pole.

* * * * *